United States Patent
Lee et al.

(10) Patent No.: US 8,536,028 B1
(45) Date of Patent: Sep. 17, 2013

(54) SELF ALIGNMENT AND ASSEMBLY FABRICATION METHOD FOR STACKING MULTIPLE MATERIAL LAYERS

(71) Applicant: National Tsing Hua University, Hsinchu (TW)

(72) Inventors: Ming-Chang Lee, Hsinchu (TW); Chih-Kuo Tseng, Hsinchu (TW); Zhong-Da Tian, Hsinchu (TW)

(73) Assignee: National Tsing Hua University, Hsinchu (TW)

( * ) Notice: Subject to any disclaimer, the term of this patent is extended or adjusted under 35 U.S.C. 154(b) by 0 days.

(21) Appl. No.: 13/738,979

(22) Filed: Jan. 10, 2013

(30) Foreign Application Priority Data

Aug. 17, 2012 (TW) .............................. 101129937 A (51) Int. Cl.
*H01L 21/31* (2006.01)

(52) U.S. Cl.
USPC ........... 438/478; 438/455; 438/504; 438/694; 257/E21.12

(58) Field of Classification Search
USPC .................................. 438/455, 478, 504, 694
See application file for complete search history.

(56) References Cited

U.S. PATENT DOCUMENTS

| | | | | |
|---|---|---|---|---|
| 6,893,947 B2 * | 5/2005 | Martinez et al. | ............... | 438/555 |
| 8,395,191 B2 * | 3/2013 | Or-Bach et al. | ............... | 257/213 |
| 2004/0142541 A1 * | 7/2004 | Cohen et al. | ................... | 438/479 |
| 2004/0161911 A1 * | 8/2004 | Chu et al. | ........................ | 438/479 |
| 2009/0026459 A1 * | 1/2009 | Chu et al. | ........................ | 257/65 |
| 2010/0230721 A1 * | 9/2010 | Yasutake | ........................ | 257/192 |
| 2012/0003799 A1 * | 1/2012 | Kim et al. | ..................... | 438/233 |
| 2013/0126944 A1 * | 5/2013 | Adam et al. | .................. | 257/197 |

* cited by examiner

Primary Examiner — Alexander Ghyka (57) ABSTRACT

The present invention relates to a self alignment and assembly fabrication method for stacking multiple material layers, wherein a variety of homogeneous/heterogeneous materials can be stacked on a substrate by this self alignment and assembly fabrication method, without using any epitaxial buffer layers or gradient buffer layers; Moreover, these stacked materials can be single crystal, polycrystalline or non-crystalline phase materials. So that, by applying this self alignment and assembly fabrication method to fabricate a multi-layer device, not only the material cost can be effectively reduced, but the wafer alignment problem existing in the conventional wafer bonding process can also be solved. In addition, in the present invention, rapid melting growth (RMG) is used for growing the multiple crystallized materials laterally and rapidly from the substrate surface by liquid phase epitaxy, therefore the thermal budget can be largely reduced when fabricating the multi-layer device.

8 Claims, 10 Drawing Sheets

SELF ALIGNMENT AND ASSEMBLY FABRICATION METHOD FOR STACKING MULTIPLE MATERIAL LAYERS

BACKGROUND OF THE INVENTION

1. Field of the Invention

The present invention relates to a manufacturing method with low thermal budget used for stacking multiple material layers on a substrate, and more particularly, to a self alignment and assembly fabrication method for stacking multiple material layers.

2. Description of the Prior Art

Silicon is currently a conventional semiconductor material, which is now widely used in CMOS process and becomes an indispensable material for Integrated Circuits (ICs). However, silicon still can not be broadly applied to optoelectronic and high-frequency communications due to the limitation on its electron mobility (1350 cm$^2$/V-S), hole mobility (480 cm$^2$/V-S) and energy gap (1.12 eV). On the contrary, germanium (Ge) has higher electron mobility (~3900 cm$^2$/V-S) and hole mobility (1900 cm$^2$/V-S) as well as lower energy gap (0.67 eV), therefore research and academic institutions all commit to the researches of germanium materials in optoelectronic and high-frequency communications.

Recently, epitaxial films of Silicon-germanium (SiGe) become popular material, and furthermore, the so-called hetero junction semiconductor device formed by silicon-germanium ($Si_{1-x}Ge_x$) and silicon substrate are gradually replacing the application of amorphous silicon in optoelectronics, CMOS gate and thermal radiation sensor. It is well-known that the lattice constants of pure silicon material and pure germanium material are 5.43 Å and 5.65 Å, respectively; so that, a lattice mismatch of 4.2% would be formed between silicon and germanium when growing $Si_{1-x}Ge_x$ epitaxial film on a silicon substrate.

Figure 1:
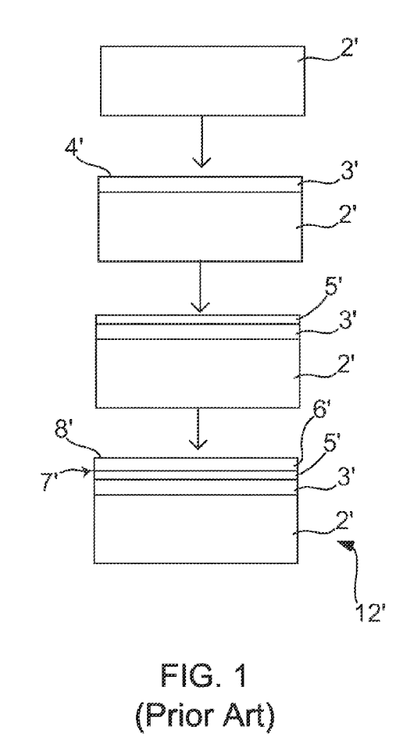
FIG. 1 is a schematic process view of a conventional semiconductor heterostructure manufacturing method.

For growing $Si_{1-x}Ge_x$ epitaxial film on silicon substrate, R.O.C. patent of TW 1358755 teaches a method for manufacturing a semiconductor heterostructure. Please refer to FIG. 1, which illustrates a schematic process flow of the semiconductor heterostructure manufacturing method. As shown in FIG. 1, the method firstly grows a buffer layer 3' of $Si_{1-x}Ge_x$ on a Si substrate 2' by epitaxy, wherein the concentration of Si/Ge in the buffer layer 3' is changed according to the thickness of the buffer layer 3', so as to make the lattice constant of the buffer layer 3' be slowly changed. Next, a smooth layer 5' having constant Si/Ge concentration is grown on the buffer layer 3', and sequentially, a top layer 6' of strain silicon is deposited on the smooth layer 5'; Then, a donor wafer 12' is completed. Thus, according to the above-mentioned semiconductor heterostructure manufacturing method proposed by TW 1358755, it is able to know that the $Si_{1-x}Ge_x$ epitaxial film can be easily grown on silicon substrate through the assist of the buffer layer and the strain silicon layer.

Besides the semiconductor heterostructure manufacturing method taught by TW 1358755, many research and academic institutions also propose some technologies for manufacturing semiconductor heterostructure; However, in summary, the conventional semiconductor heterostructure manufacturing methods still include the shortcoming and drawbacks as follows:

1. Whatever Ultra-high Vacuum Chemical Vapor Deposition (HV/CVD), Rapid-Thermal Chemical Vapor Deposition (RTCVD), Rapid-Thermal Chemical Vapor Deposition (RTCVD), or Metal-organic Chemical Vapor Deposition (MOCVD), the process temperature of 600° C. ~1000° C. lead to high thermal budget in semiconductor heterostructure manufacturing process.

2. Although the lattice mismatch issue can be solved by using the buffer layer in the conventional semiconductor heterostructure manufacturing method, not all of the heterogeneous materials have a suitable buffer layer for allowing it to be grown on Si substrate; in addition, because the buffer layer is full of lattice defects, which are against to vertical integration of devices. Although some semiconductor fabricator use direct wafer bonding way to solve above-mentioned issue, the wafer alignment between a donor wafer and an operation wafer and how to remove the substrate become new issues.

Accordingly, in view of the conventional semiconductor heterostructure manufacturing method still have shortcomings and drawbacks, the inventor of the present application has made great efforts to make inventive research thereon and eventually provided a self alignment and assembly fabrication method for stacking multiple material layers.

SUMMARY OF THE INVENTION

The primary objective of the present invention is to provide self alignment and assembly fabrication method for stacking multiple material layers, in which, multiple homogeneous/heterogeneous materials can be stacked on a substrate by self alignment, so that this self alignment and assembly fabrication method is able to solve the alignment issue existing in conventional semiconductor heterostructure manufacturing technology.

The another objective of the present invention is to provide self alignment and assembly fabrication method for stacking multiple material layers, in which, multiple homogeneous/heterogeneous materials can be stacked on a substrate by self alignment, and the multiple material layers can be laterally grown from the substrate surface by rapid melting growth (RMG) process as an example; therefore the thermal budget in the manufacturing process can be largely reduced.

Accordingly, to achieve the above objectives of the present invention, the inventor of the present invention provides a self alignment and assembly fabrication method for stacking multiple material layers, comprising the steps of:

(1) fabricating a substrate;

(2) forming a first isolation layer having a first through hole on the substrate;

(3) forming a first material on the substrate and the first isolation layer, wherein the partial first material fills into the first through hole and contacts with the substrate, and then defining the pattern and structure of the first material on the first isolation layer by way of photolithography and etching;

(4) forming a second isolation layer having a second through hole on the substrate;

(5) forming a second material on the second isolation layer, wherein the partial second material fills into the second through hole and contacts with the substrate, and then defining the pattern and structure of the second material on the second isolation layer by way of photolithography and etching;

(6) forming a third isolation layer having a third through hole on the substrate;

(7) forming a third material on the third isolation layer, wherein the partial third material fills into the third through hole and contacts with the substrate, and then defining the pattern and structure of the third material on the third isolation layer by way of photolithography and etching;

(8) forming a fourth isolation layer for covering the third isolation layer, the third material and the third through hole;

(9) making the first material, the second material and the third material grow epitaxially from the surface of the substrate by using a rapid thermal anneal process;

(10) removing the first isolation layer, the second isolation layer, the third isolation layer, and the fourth isolation layer through a wet etching process, such that the first material is bonded to the substrate by self alignment, the second material is bonded to the first material by self alignment, and the third material is bonded to the second material by self alignment;

(11) forming a hard mask layer on the substrate, the first material, the second material, and the third material; and (12) selectively etching the first material, the second material, and the third material via the hard mask, so as to define the primary portions of the first material, the second material, and the third material, and remove redundancy portion.

BRIEF DESCRIPTION OF THE DRAWINGS

The invention as well as a preferred mode of use and advantages thereof will be best understood by referring to the following detailed description of an illustrative embodiment in conjunction with the accompanying drawings, wherein.

DETAILED DESCRIPTION OF THE PREFERRED EMBODIMENTS

To more clearly describe a self alignment and assembly fabrication method for stacking multiple material layers according to the present invention, embodiments of the present invention will be described in detail with reference to the attached drawings hereinafter.

Figure 2A:
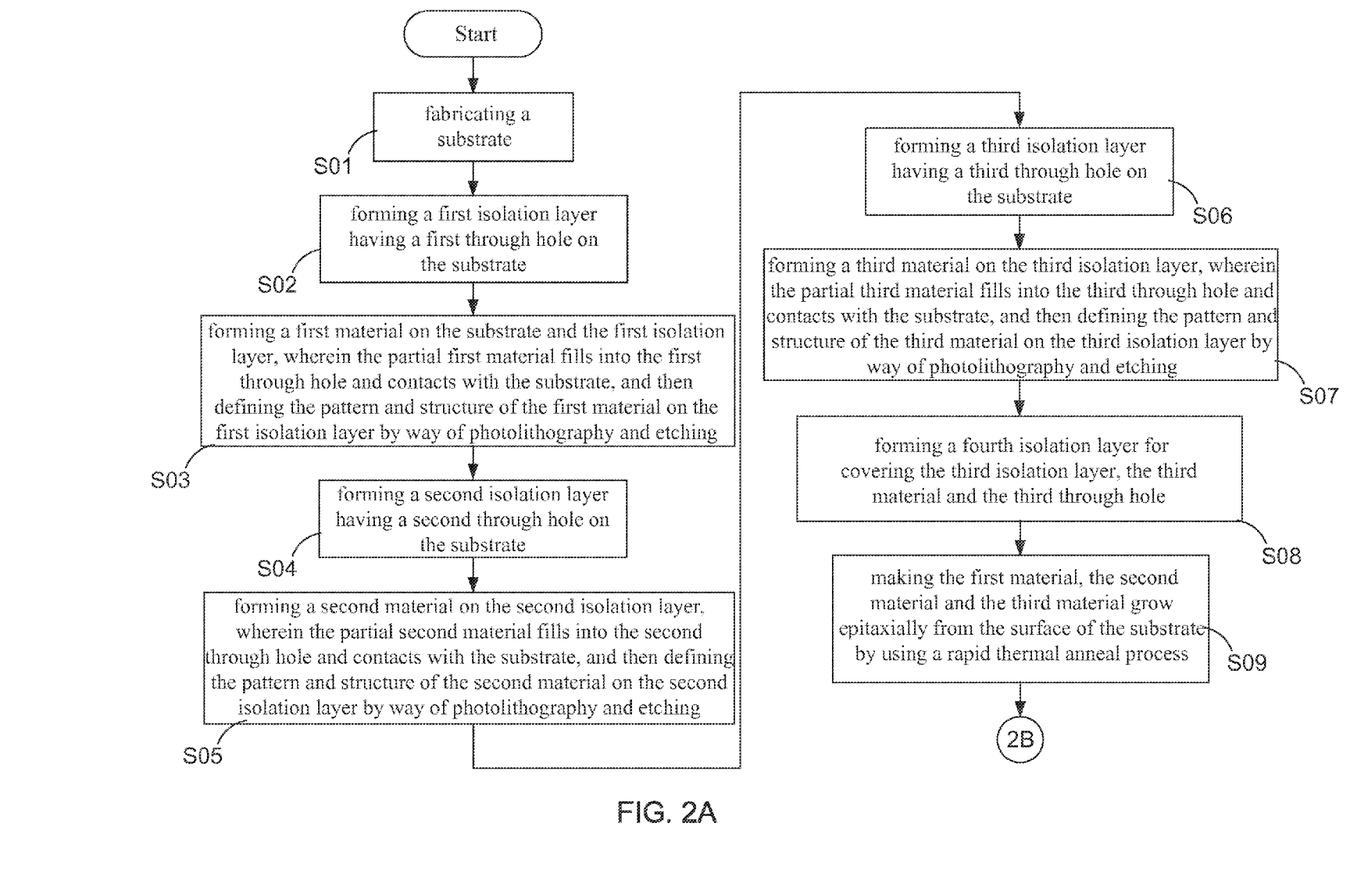
FIGS. 2A and 2B are flowcharts of a self alignment and assembly fabrication method for stacking multiple material layers according to the present invention.
Figure 2B:
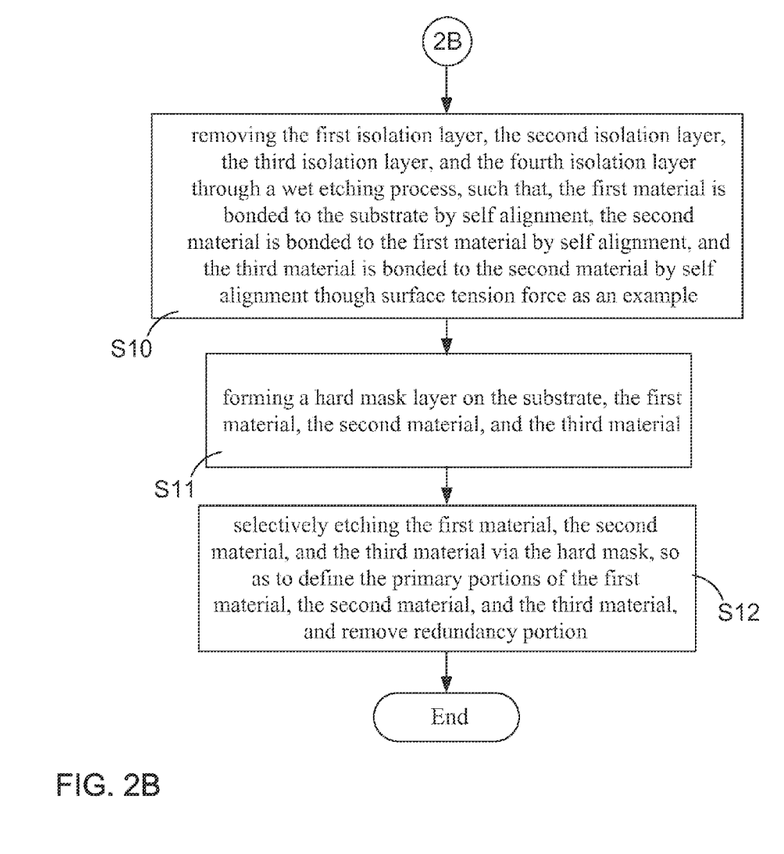
Figure 3:
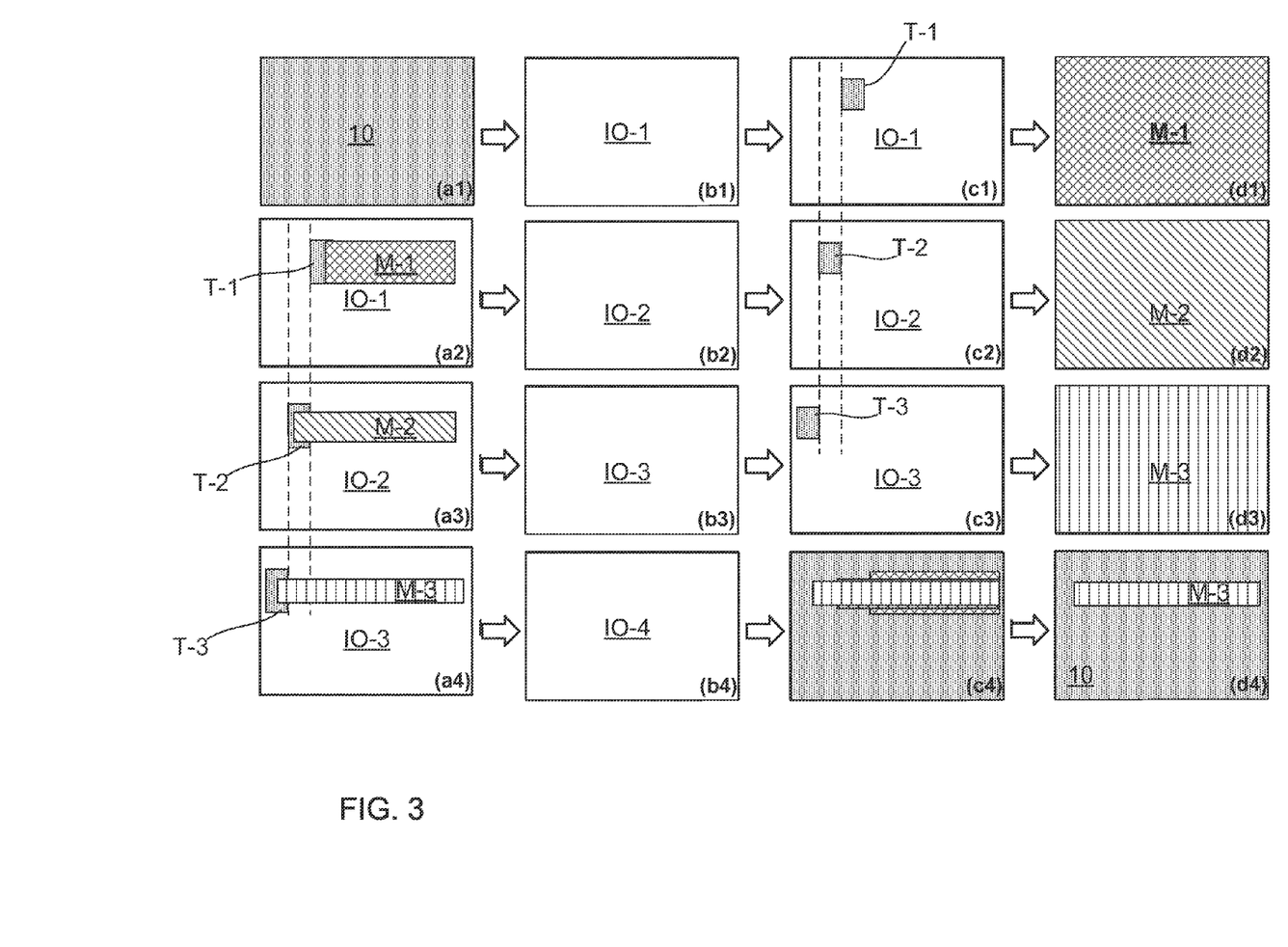
FIG. 3 is a schematic manufacturing process diagram of the self alignment and assembly fabrication method for stacking multiple material layers according to the present invention.
Figure 5:
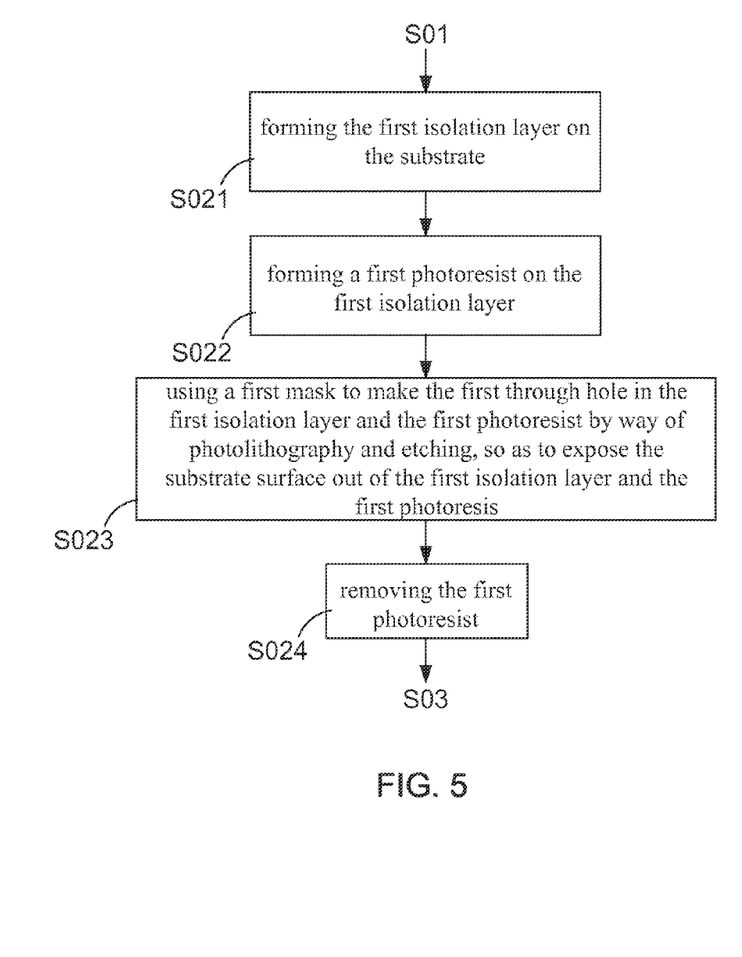
FIG. 5 is a detailed flowchart of step (S02)

Referring FIGS. 2A and 2B, there are shown flowcharts of the self alignment and assembly fabrication method for stacking multiple material layers according to the present invention; moreover, please refer to FIG. 3, which illustrates a schematic manufacturing process diagram of the self alignment and assembly fabrication method for stacking multiple material layers. The self alignment and assembly fabrication method for stacking multiple material layers mainly includes 13 steps of:

As shown in FIG. 2A and FIG. 3, the method firstly proceeds to step (S01) for fabricating a substrate 10 (as shown in (a1) of FIG. 3), wherein the substrate 10 can be a silicon substrate, an SOI (silicon on insulator) substrate or a sapphire substrate. Next, in step (S02), a first isolation layer IO-1 having a first through hole T-1 is formed on the substrate 10, wherein the first isolation layer IO-1 is an oxidation layer. Please refer to FIG. 5, which illustrates a detailed flowchart of step (S02); as shown in FIG. 5, the step (S02) includes 4 detailed steps of: step (S21), forming the first isolation layer IO-1 on the substrate 10 (as shown in (b1) of FIG. 3); step (S22), forming a first photoresist on the first isolation layer IO-1; step (S23), using a first mask to make the first through hole T-1 in the first isolation layer IO-1 and the first photoresist by way of photolithography and etching, so as to expose the substrate 10 surface out of the first isolation layer IO-1 and the first photoresist; and step (S24), removing the first photoresist (as shown in (e1) of FIG. 3).

Figure 6:
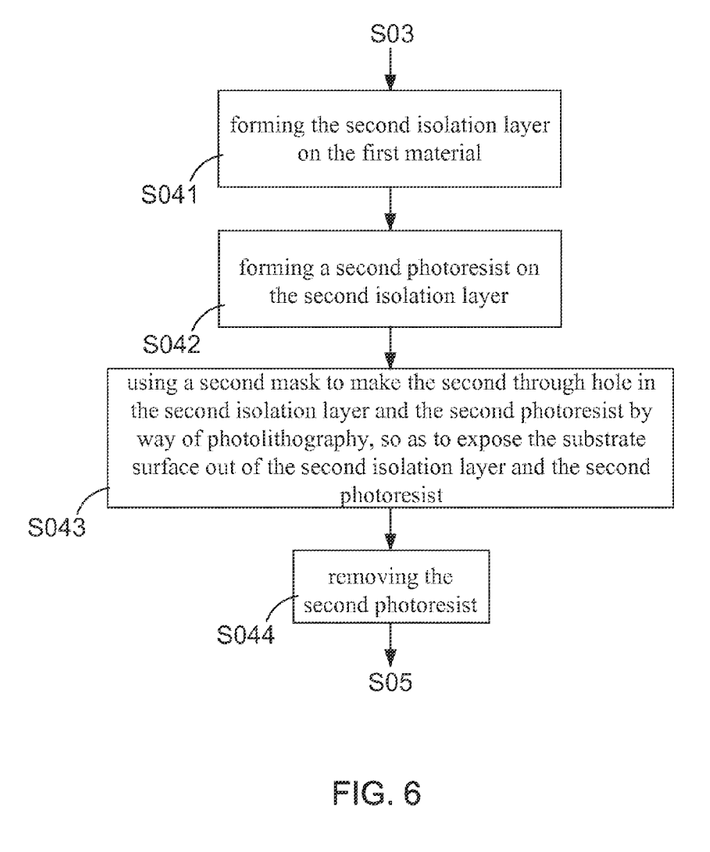
FIG. 6 is a detailed flowchart of step (S04)

After finishing the step (S02), as shown in FIG. 2A and FIG. 3, the method continuously proceeds to step (S03), forming a first material M-1 on the substrate 10 and the first isolation layer IO-1 (as shown in (d1) of FIG. 3), wherein the partial first material M-1 fills into the first through hole T-1 and contacts with the substrate 10, and then defining the pattern and structure of the first material M-1 on the first isolation layer IO-1 by way of photolithography and etching (as shown in (a2) of FIG. 3). Next, in step (S04), a second isolation layer IO-2 having a second through hole T-2 is formed on the substrate, wherein the second isolation layer IO-2 is also an oxidation layer. Please refer to FIG. 6, which illustrates a detailed flowchart of step (S04); as shown in FIG. 6, the step (S04) also includes 4 detailed steps of: step (S041), forming the second isolation layer IO-2 on the first material M-1 (as shown in (b2) of FIG. 3); step (S042), forming a second photoresist on the second isolation layer IO-2; step (S043), using a second mask to make the second through hole T-2 in the second isolation layer IO-2 and the second photoresist by way of photolithography and etching, so as to expose the substrate 10 surface out of the second isolation layer IO-2 and the second photoresist; and step (S044), removing the second photoresist (as shown in (c2) of FIG. 3).

Figure 7:
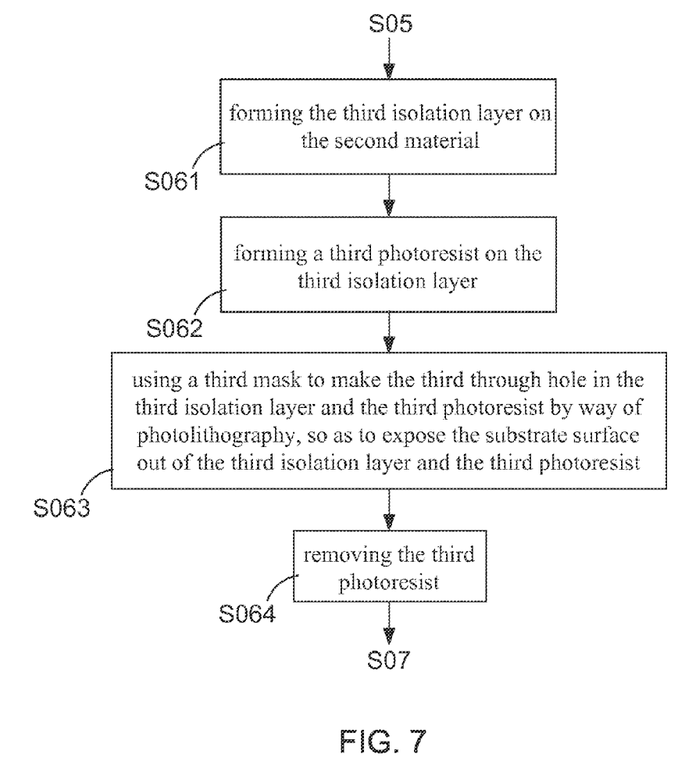
FIG. 7 is a detailed flowchart of step (S06).

When completing the step (S04), as shown in FIG. 2A and FIG. 3, the method continuously proceeds to step (S05), forming a second material M-2 on the second isolation layer IO-2 (as shown in (d2) of FIG. 3), wherein the partial second material M-2 fills into the second through hole T-2 and contacts with the substrate 10, and then defining the pattern and structure of the second material M-2 on the second isolation layer IO-2 by way of photolithography and etching (as shown in (a3) of FIG. 3). Next, in step (S06), a third isolation layer IO-2 having a third through hole T-3 is formed on the substrate, wherein the third isolation layer IO-3 is also an oxidation layer. Please refer to FIG. 7, which illustrates a detailed flowchart of step (S06); as shown in FIG. 7, the step (S06) also includes 4 detailed steps of: step (S061), forming the third isolation layer IO-3 on the second material M-2 (as shown in (b3) of FIG. 3); step (S062), forming a third photoresist on the third isolation layer IO-2; step (S063), using a third mask to make the third through hole T-3 in the third isolation layer IO-3 and the third photoresist by way of photolithography and etching, so as to expose the substrate 10 surface out of the third isolation layer IO-3 and the third photoresist; and step (S064), removing the third photoresist (as shown in (c3) of FIG. 3).

After finishing the step (S06), as shown in FIG. 2A and FIG. 3, the method is sequentially proceeds to step (S07), forming a third material M-3 on the third isolation layer IO-3 (as shown in (d3) of FIG. 3), wherein the partial third material M-3 fills into the third through hole T-3 and contacts with the substrate 10, and then defining the pattern and structure of the third material M-3 on the third isolation layer IO-3 by way of photolithography and etching (as shown in (a4) of FIG. 3). Next, as shown in FIG. 2B and FIG. 3, step (S08) is proceeded to forming a fourth isolation layer IO-4 to cover the third isolation layer IO-3, the third material M-3 and the third through hole T-3 (as shown in (b4) of FIG. 3).

Figure 4A:
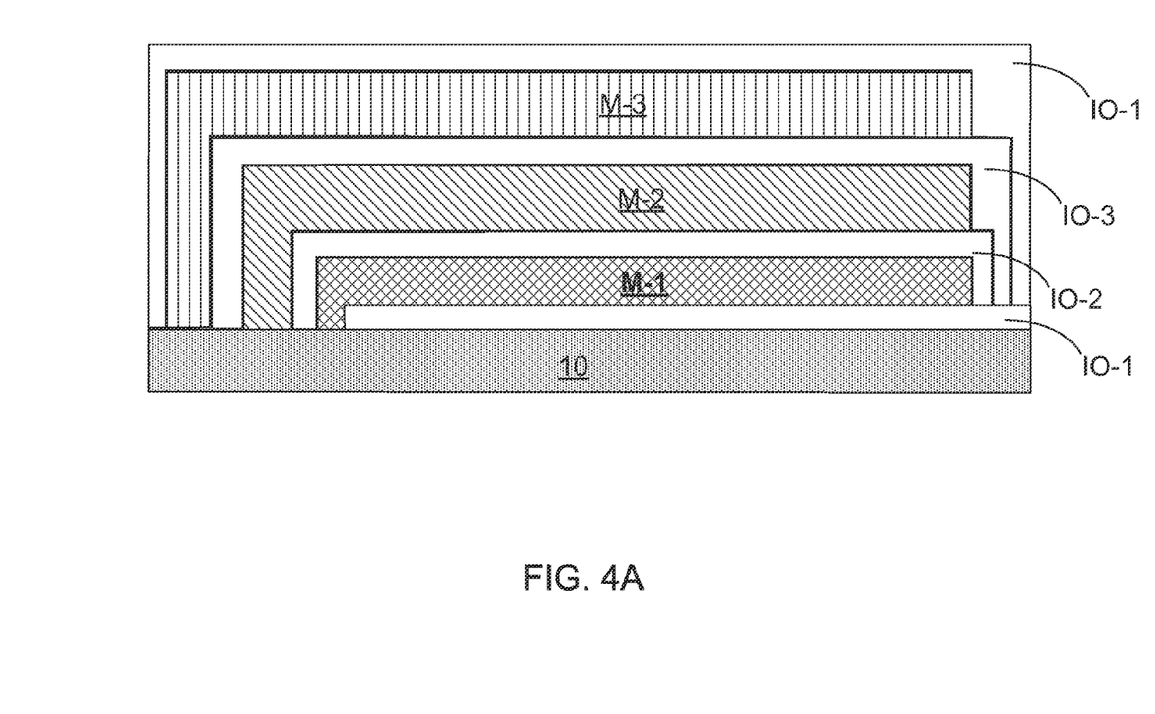
FIGS. 4A, 4B and 4C are side views of the self alignment stack of multiple material layers.
Figure 4B:
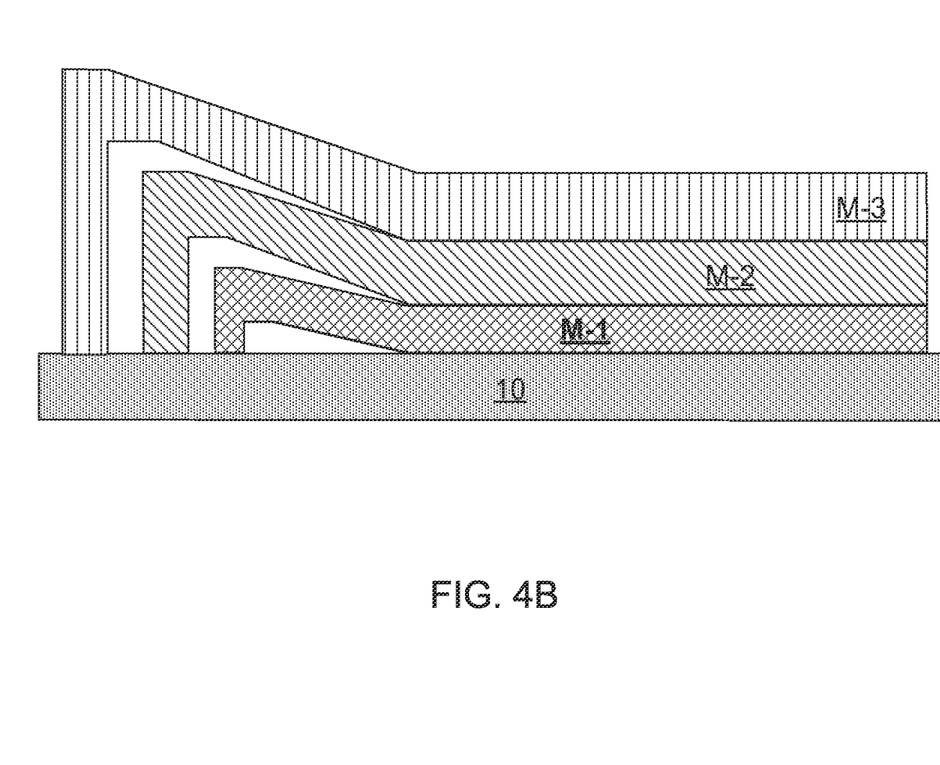
Figure 4C:
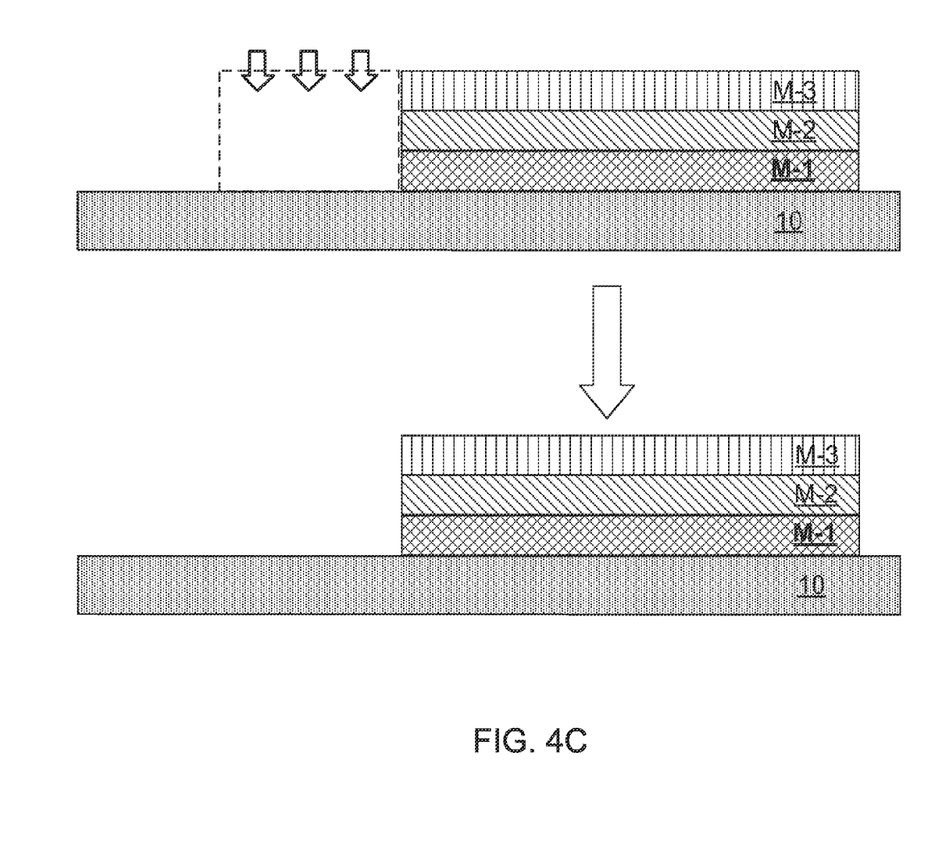

Referring to FIG. 4A-4C, there are shown side views of the self alignment stack of multiple material layers. As shown in FIG. 2B, FIG. 3 and FIG. 4A, a rapid thermal anneal process is executed in step (S09) for making the first material M-1, the second material M-2 and the third material M-3 grow epitaxially from the surface of the substrate 10, herein the temperature used in rapid thermal anneal process is adequate for melting the first material M-1, the second material M-2 and the third material M-3, such that the first material M-1, the second material M-2 and the third material M-3 would laterally grow from the substrate 10 surface by liquid phase epitaxy, which is called Rapid Melting Growth (RMG).

Continuously, as shown in FIG. 2B, FIG. 3 and FIG. 4B, the method next proceeds to step (S10), removing the first isolation layer IO-1, the second isolation layer IO-2, the third isolation layer IO-3, and the fourth isolation layer IO-4 through a wet etching process, such that, the first material M-1 is bonded to the substrate 10 by self alignment, the second material M-2 is bonded to the first material M-1 by self alignment, and the third material M-3 is bonded to the second material M-2 by self alignment though surface tension force as an example (as shown in (c4) of FIG. 3).

Finally, as shown in FIG. 2B, FIG. 3 and FIG. 4C, in step (S011) and step (S012), a hard mask layer is formed on the substrate 10, the first material M-1, the second material M-2, and the third material M-3, and then the first material M-1, the second material M-2, and the third material M-3 are selectively etched via the hard mask, so as to define the primary portions of the first material M-1, the second material M-2, and the third material M-3, and remove redundancy portion (as shown in (d4) of FIG. 3).

Therefore, FIG. 4 shows a self aligned stack structure of multiple materials, in which, the first material M-1, the second material M-2 and the third material M-3 are heterogeneous materials opposite to the substrate 10. For example, when it uses silicon substrate as the substrate 10 in above-mentioned method, the first material M-1, the second material M-2 and the third material M-3 may be germanium (Ge) or III-V group material in Periodic Table of the Elements. So that, by using the self alignment and assembly fabrication method of the present invention, the first material, the second material and the third material can be stacked on the silicon substrate by a easy and rapid way. Besides, when it uses sapphire ($Al_2O_3$) as the substrate 10 in above-mentioned method, InGaN/AlGaN can be stacked on the sapphire substrate by using the self alignment and assembly fabrication method of the present invention, so as to fabricate blue/white LEDs.

Thus, through above descriptions, the self alignment and assembly fabrication method for stacking multiple material layers of the present invention has been clearly and completely introduced and described; in summary, the present invention includes the advantages of:

(1) By using this self alignment and assembly fabrication method, multiple homogeneous/heterogeneous materials can be stacked on a substrate by self alignment, and those materials can be monocrystalline, polycrystalline or non-crystalline phase materials. So that, the self alignment and assembly fabrication method of the present invention can solve the alignment issue existing in conventional semiconductor heterostructure manufacturing technology.

(2) In the self alignment and assembly fabrication method, the multiple material layers can be laterally grown from the substrate surface by Rapid Melting Growth (RMG) method as an example; therefore the thermal budget in the manufacturing process is largely reduced.

(3) In the self alignment and assembly fabrication method, the multiple material layers can be bonded or stacked on the substrate without using any epitaxial buffer layers or gradient buffer layers; therefore the material cost in the manufacturing process can be reduced and the fabrication process is less critical.

The above description is made on embodiments of the present invention. However, the embodiments are not intended to limit scope of the present invention, and all equivalent implementations or alterations within the spirit of the present invention still fall within the scope of the present invention.

What is claimed is:

1. A self alignment and assembly fabrication method for stacking multiple material layers, comprising the steps of:
   (1) fabricating a substrate;
   (2) forming a first isolation layer having a first through hole on the substrate;
   (3) forming a first material on the substrate and the first isolation layer, wherein the partial first material fills into the first through hole and contacts with the substrate, and then defining the pattern and structure of the first material on the first isolation layer by way of photolithography and etching;
   (4) forming a second isolation layer having a second through hole on the substrate;
   (5) forming a second material on the second isolation layer, wherein the partial second material fills into the second through hole and contacts with the substrate, and then defining the pattern and structure of the second material on the second isolation layer by way of photolithography and etching;
   (6) forming a third isolation layer having a third through hole on the substrate;
   (7) forming a third material on the third isolation layer, wherein the partial third material fills into the third through hole and contacts with the substrate, and then defining the pattern and structure of the third material on the third isolation layer by way of photolithography and etching;
   (8) forming a fourth isolation layer for covering the third isolation layer, the third material and the third through hole;
   (9) making the first material, the second material and the third material grow epitaxially from the surface of the substrate by using a rapid thermal anneal process;
   (10) removing the first isolation layer, the second isolation layer, the third isolation layer, and the fourth isolation layer through a wet etching process, such that the first material is bonded to the substrate by self alignment, the second material is bonded to the first material by self alignment, and the third material is bonded to the second material by self alignment;
   (11) forming a hard mask layer on the substrate, the first material, the second material, and the third material; and
   (12) selectively etching the first material, the second material, and the third material via the hard mask, so as to define the primary portions of the first material, the second material, and the third material, and remove redundancy portion.

2. The self alignment and assembly fabrication method for stacking multiple material layers of claim 1, wherein the substrate is selected from the group consisting of: silicon substrate, SOI (silicon on insulator) substrate and sapphire substrate.

3. The self alignment and assembly fabrication method for stacking multiple material layers of claim 1, wherein the first isolation layer, the second isolation layer, the third isolation layer, and the fourth isolation layer are made from materials which are selectively removed by wet etching or gas-phase etching process.

4. The self alignment and assembly fabrication method for stacking multiple material layers of claim 2, wherein the first material, the second material and the third material are heterogeneous materials opposite to the substrate.

5. The self alignment and assembly fabrication method for stacking multiple material layers of claim 2, wherein the first material, the second material and the third material are homogeneous materials opposite to the substrate.

6. The self alignment and assembly fabrication method for stacking multiple material layers of claim 1, wherein the step (2) is completed through the steps of:
(21) forming the first isolation layer on the substrate;
(22) forming a first photoresist on the first isolation layer;
(23) using a first mask to make the first through hole in the first isolation layer and the first photoresist by way of photolithography and etching, so as to expose the substrate surface out of the first isolation layer and the first photoresist; and
(24) removing the first photoresist.

7. The self alignment and assembly fabrication method for stacking multiple material layers of claim 6, wherein the step (4) is completed through the steps of:
(41) forming the second isolation layer on the first material;
(42) forming a second photoresist on the second isolation layer;
(43) using a second mask to make the second through hole in the second isolation layer and the second photoresist by way of photolithography and etching, so as to expose the substrate surface out of the second isolation layer and the second photoresist; and
(44) removing the second photoresist.

8. The self alignment and assembly fabrication method for stacking multi material layers of claim 7, wherein the step (6) is completed through the steps of:
(61) forming the third isolation layer on the second material;
(62) forming a third photoresist on the third isolation layer;
(63) using a third mask to make the third through hole in the third isolation layer and the third photoresist by way of photolithography and etching, so as to expose the substrate surface out of the third isolation layer and the third photoresist; and
(64) removing the third photoresist.

* * * * *